United States Patent [19]

Hekimian et al.

[11] 3,792,357

[45] Feb. 12, 1974

[54] PRE-EMPHASIS LOOP FILTER FOR IMPROVED FM DEMODULATOR NOISE THRESHOLD PERFORMANCE

[76] Inventors: Norris C. Hekimian, 1517 Baylor Ave., Rockville, Md. 20850; Walter Mack, 6523 32nd St., Falls Church, Va. 22046

[22] Filed: May 24, 1972

[21] Appl. No.: 256,240

Related U.S. Application Data

[63] Continuation-in-part of Ser. No. 889,432, Dec. 31, 1969, abandoned.

[52] U.S. Cl. .................... 325/46, 325/347, 325/349, 325/425, 325/427, 325/476

[51] Int. Cl. .............................................. H04b 1/62

[58] Field of Search ..... 325/46, 324, 344, 347, 425, 325/427, 476, 490, 349; 333/17

[56] References Cited

UNITED STATES PATENTS

| | | | |
|---|---|---|---|
| 2,362,000 | 11/1944 | Tunick | 325/46 |
| 2,969,459 | 1/1961 | Hern | 325/427 |
| 2,976,408 | 3/1961 | Colaguori | 325/427 |
| 2,540,643 | 2/1951 | Armstrong | 325/344 |
| 3,135,934 | 6/1969 | Schoenike | 333/17 |

*Primary Examiner*—Albert J. Mayer
*Attorney, Agent, or Firm*—John J. Byrne

[57] ABSTRACT

The performance of a noise threshold extension circuit for an FM demodulator is substantially improved by the incorporation of a pre-emphasis-type filter in the control loop of the circuit, which filter "matches" the frequency response characteristic of the loop to that of the modulating signal. The threshold extension circuit preferably includes a steerable, narrowband tracking filter which tracks the FM signal so that extraneous noise is filtered out.

8 Claims, 6 Drawing Figures

PATENTED FEB 12 1974

3,792,357

SHEET 1 OF 3

INVENTORS
NORRIS C. HEKIMIAN
WALTER MACK

BY John J. Byrne
ATTORNEY

INVENTORS
NORRIS C. HEKIMIAN
WALTER MACK
BY John J. Byrne
ATTORNEY

PRE-EMPHASIS LOOP FILTER FOR IMPROVED FM DEMODULATOR NOISE THRESHOLD PERFORMANCE

This is a continuation-in-part of U.S. Pat. application Ser. No. 889,432, filed Dec. 31, 1969, entitled PRE-EMPHASIS LOOP FILTER FOR IMPROVED FM DEMODULATOR NOISE THRESHOLD PERFORMANCE, now abandoned.

FIELD OF THE INVENTION

The present invention relates to frequency modulation communication systems and more particularly to arrangements for improving the noise threshold performance of such systems.

BACKGROUND OF THE INVENTION

A number of approaches have been proposed for extending the noise threshold in FM communication systems. The so-called noise threshold or the threshold effect may be loosely defined as the FM carrier-to-noise ratio at which noise begins to "take over" the system. For a carrier-to-noise ratio above the threshold value, an FM system will perform in a predictable manner whereas for carrier-to-noise ratios below this value the noise improvement provided by the use of an FM system deteriorates rapidly. The threshold level for a particular system depends upon the FM carrier-to-noise ratio and the modulation index of the system and for a relatively large modulation index is taken to occur at carrier-to-noise ratios of about 13db.

An example of an early system used in extending the noise threshold is the FM demodulator with feedback (FMFB demodulator) disclosed in U.S. Pat. No. 2,075,503. With the advent of space and satellite communication there has been a renewed interest in such systems and greater demands have been placed thereon. The so-called "phase-locked loop," which is used extensively in tracking applications and for maintaining the desired phase coherence of locally generated signals, has also been used as an FM demodulator and has provided threshold-reduction properties similar to those of the FMFB demodulator. Reference is made to Schwartz et al. *Communication Systems and Techniques*, McGraw-Hill, pages 154–163 for a discussion of the noise threshold extension provided by phase-locked loop and FMFB demodulators.

SUMMARY OF THE INVENTION

In accordance with the invention, a method and an apparatus are provided for greatly improving the noise threshold performance of an FM demodulator. Considered relative to the broader aspects thereof, the invention relates to the incorporation of a pre-emphasis type filter in the control loop of a noise threshold extension circuit, which filter "matches" the frequency response characteristic of the loop to that of the modulating frequency.

The present invention will be discussed with regard to the noise threshold reduction provided in an FM tracking filter circuit although it should be understood that the invention may also be incorporated into the other threshold extension circuits described hereinabove. In accordance with a presently preferred embodiment of the invention, a tracking filter circuit is provided for processing an FM signal at the IF frequency thereof so that the total signal-to-noise ratio of the signal is improved. In general, the signal processing is accomplished by providing a narrowband, steerable filter network which follows the instantaneous frequency of the FM signals and thus filters out extraneous noise while permitting passage of the information-bearing signals. The tracking filter circuit includes two branches, a reference branch and a branch including the tracking filter network itself. A phase detector, the output of which is connected through a control loop to a frequency band control input of the tracking filter, compares the phases of the signals from the two branches and provides a control or correction voltage in accordance with this comparison which is applied to the filter network in such a manner as to cause the network to follow the instantaneous frequency of the IF input signal. The FM signal is then demodulated by a conventional FM demodulator with a resultant improvement in threshold performance. The presence of the tracking filter circuit itself enables useful operation of the demodulator at signal-to-noise ratios below approximately 10 db.

In accordance with a very important feature of the invention, the performance of the tracking filter is greatly enhanced by the incorporation of a loop filter in the control loop which is of the same type as the pre-emphasis filter network of the modulator circuit in the transmitter and which tends to match the response of the control loop to the frequency response of the modulating signal. The incorporation of the pre-emphasis type filter improves the threshold performance of the modulator as well as substantially reduces the intermodulation distortion to which threshold extension circuits are prone.

These and other objects of the invention will become more apparent to those skilled in the art by reference to the following detailed description when viewed in light of the accompanying drawings wherein:

DESCRIPTION OF THE PREFERRED EMBODIMENTS

Figure 1:
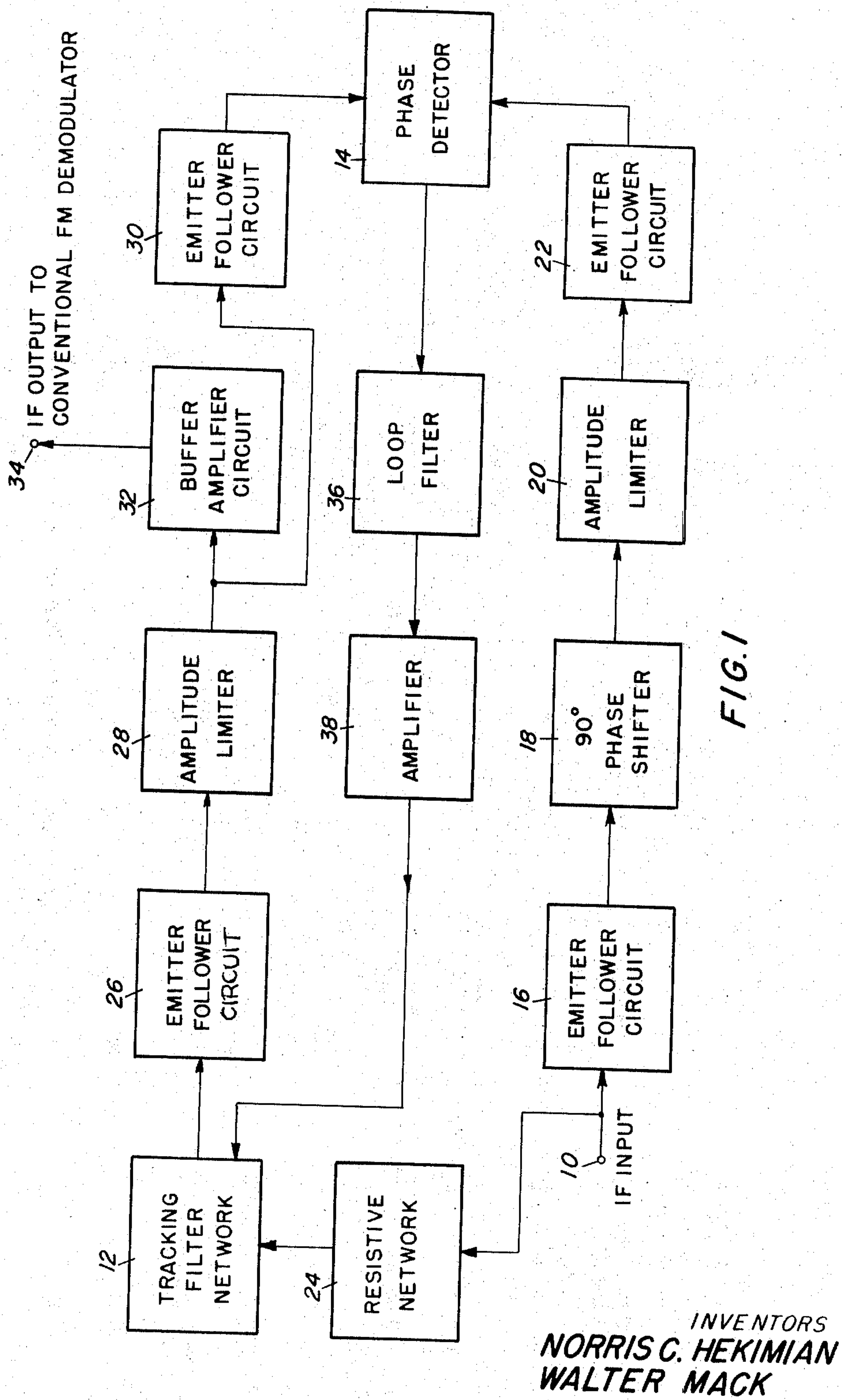
FIG. 1 is a block diagram of a presently preferred embodiment of the tracking filter circuit of the invention.

Referring to FIG. 1, there is shown a presently preferred embodiment of tracking filter circuit utilized in processing a FM signal at the IF frequency thereof so as to improve the signal-to-noise ratio of the signal. Two branch circuits are connected to the IF input terminal 10, the first of which contains a tracking filter network 12 and the second of which provides a reference signal. Both branches are connected to a phase detector 14 which compares the phase of the reference signal with the phase of the output signal of the first branch.

The second branch includes an emitter follower circuit 16 connected to IF input terminal 10 and to a 90° shifting network 18. Phase shifter 18 is included because of the characteristics of phase detector 14, the quiescent or reference condition of the phase detector 14 requiring that the input signals thereto be in phase quadrature. The output of phase shifter 18 is connected to an amplitude limiter circuit 20 which ensures that the output of phase detector 14 is independent of the signal amplitudes of the inputs thereto. The output of limiter 20 is connected through a second emitter follower circuit 22 to one input of phase detector 14.

The circuitry of the first branch is similar to that of the second branch so that the phase relationship between the branches is preserved. The first branch includes a resistive network 24 which is connected to IF terminal 10 and which is used in controlling the band width of the tracking filter network 12. The output of the tracking filter 12 is connected to phase detector 14 through a first emitter follower circuit 26, an amplitude limiter circuit 28 and second emitter follower circuit 30. The output of limiter 28 is also connected through a buffer amplifier 32 to the IF output terminal 34. The IF output is applied to a conventional FM demodulator (not shown). It will be appreciated that the receiver circuit of which the tracking filter circuit of FIG. 1 is a part may also include a receiving antenna (not shown) as well as conventional RF amplifier, mixer and local oscillator circuits (not shown) for developing an IF input signal at IF input terminal 10.

The output of phase detector 14 is connected through a loop filter 36 and an amplifier circuit 38 to tracking filter network 12. The tracking filter 12 preferably includes a voltage-variable capacitance diode or varactor so that the capacitance of the tracking filter network 12 and, consequently, the resonant frequency thereof, is a function of the control voltage provided at the output of phase detector 14.

Considering the operation of the circuit of FIG. 1, in the quiescent state thereof with an unmodulated signal present at IF input terminal 10, the tracking filter network 12 will be centered at the input frequency and the phase differences between the signals provided by the two branches will be substantially zero. Under these conditions, the control or correction voltage produced by phase detector 14 will also be zero. However, under conditions where a modulated input signal applied to IF input terminal 10 the frequency of the signal applied to tracking filter network 12 is no longer coincident with the center frequency of network 12 and thus phase detector 14 will produce an error voltage corresponding to the instantaneous frequency deviation. This voltage is transformed by the loop filter 36 into a control or correction signal which is applied to tracking filter network 12 and which causes the center frequency tracking filter 12 to be shifted in accordance with the instantaneous frequency deviation of the input signal. In this way tracking filter network 12 is made to track or follow the frequency of the IF input signal at terminal 10.

Figure 2:
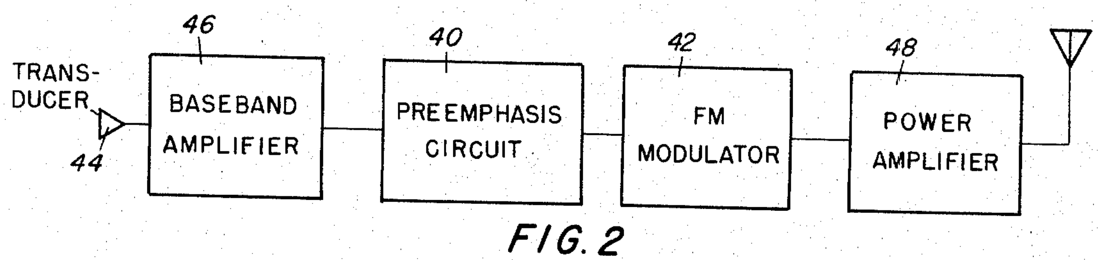
FIG. 2 is a block diagram of a simple transmitter system including a pre-emphasis circuit.

As discussed hereinabove, the tracking filter circuit of FIG. 1 enhances the operation of the conventional FM demodulator to which the IF output at terminal 34 is applied by improving the signal-to-noise ratio of the IF signal, the narrowband filter network 12 following the instantaneous frequency of the FM signal, and consequently filtering out the extraneous noise, while at the same time permitting passage of the information-bearing signal therethrough. The various control parameters of the tracking filter circuit of FIG. 12 are chosen so as to maximize the amount of noise threshold improvement which can be obtained in processing an FM signal having given characteristics such as a particular total frequency deviation and a particular top baseband frequency. The loop parameters which may be varied are the loop gain, the bandwidth of tracking filter network 12 and the loop filtering provided by loop filter 36. Varying the loop gain to achieve maximum threshold improvement is discussed hereinbelow in connection with FIGS. 5 and 6. The control loops of FM threshold extension circuits such as the FMFB and phase-locked loop demodulators discussed hereinabove as well as the tracking filter circuit of FIG. 1, are, in general, designed to have a relatively flat frequency response up to a frequency somewhat beyond the upper or top baseband frequency. However, the baseband input modulating signal of FM modulators generally do not have flat frequency responses. In fact, some form of pre-emphasis is usually applied to the baseband signal at the FM modulator in order to tailor the demodulated signal-to-noise spectrum at the demodulator to a specified characteristic. Referring to FIG. 2, a simple transmitter circuit is shown which includes a pre-emphasis circuit 40 for a modulator 42. Modulator 42 is a modulated oscillator and the remainder of the transmitter circuit includes a transducer 44, a baseband amplifier 46 and a power amplifier 48 connected as shown. For multiplex signals the pre-emphasis circuit 40 is sued at the modulator so that the combination of the triangular noise shape at the demodulator and the de-emphasis network (not shown) will result in equal signal-to-noise ratios in all channels.

The presence of frequency weighing on the modulating signal alters the restraints imposed upon the tracking capability of any frequency or phase tracking circuit which means that such a circuit should be able to track more effectively at certain rates than at others. In accordance with a very important feature of the invention, loop filter circuit 36 of the tracking filter circuit of FIG. 1 includes the same type of pre-emphasis filter circuit as does the modulator 42 of FIG. 2, that is, the same type of circuit as pre-emphasis circuit 40. In general, the filtering provided by loop filter 36 of FIG. 1 is designed such that the response of the control loop tends to "match" the frequency response of the modulating signal.

Figure 3:
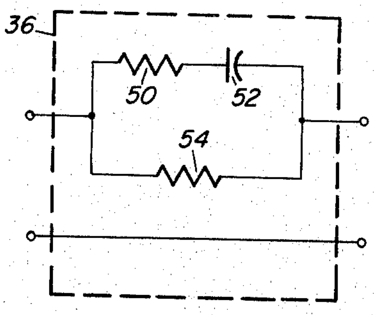
FIG. 3 is a schematic circuit diagram of the pre-emphasis type filter incorporated in the control loop of the circuit of FIG. 1.

Referring to FIG. 3, a circuit is shown which is utilized in the loop filter 36 of FIG. 1 to provide the desired frequency weighing. The circuit includes an inductance 50 and a capacitance 52 connected in parallel with a resistor 54 as shown. The circuit is topologically identical to, that is, includes the same components connected in the same way as, the pre-emphasis circuit 40 of FIG. 2. It is noted that pre-emphasis circuit 40 in the exemplary embodiment under consideration is used in the FM modulator to obtain the desired weighing of the baseband frequency for satellite communications. Although circuits 40 and 36 are topologically identical, the values of components in the loop filter circuit 36 of FIG. 1 will differ from those of the pre-emphasis circuit 40 of FIG. 2, partly because the inclusion of a particular network in a closed control loop will alter the effect of the network and also because optimum threshold performance generally necessitates a certain amount of trade-off between the various loop parameters as mentioned hereinabove. It should be noted that any network which provides the same or a similar frequency response may be utilized and should produce the same improvement in performance so long as the stability of the control loop is not jeopardized. Thus, the word "matching" used in the specification and in the appended claims is used in its general sense and is intended to include the provision of a filter having a response which is substantially similar to that of the modulating signal as discussed hereinabove. Hence, the word "matching" is not limited to merely duplicating the response of the modulating signal.

It will be understood that if the frequency weighing at the FM modulator is altered a corresponding change in the loop filter of the tracking filter circuit will be necessary to ensure that optimum performance is maintained. Although it will, of course, be appreciated that the values of the particular components in the pre-emphasis and loop filter circuits depend on a number of factors, it is thought that the values utilized in a particular application might be generally helpful. Thus in a typical 132 channel earth station deviations system having a top baseband frequency of 552 Kc, the components of the loop filter 36 have the following values: 0.51 millihenries for inductance 50;200 picofarads for capacitance 52; and 2 K ohms for resistance 54; whereas the components of the pre-emphasis circuit used have the following values: 27.3 microhenries for inductance 50; 1,945 picofarads for capacitance 52; and 272 ohms for resistance 54.

It is noted that in attempting to optimize the threshold performance of the tracking filter circuit of FIG. 1 through the use of conventional loop filtering, it was observed that the optimally-adjusted closed loop frequency response of the circuit required a heretofore unexplainable peak or "ear." In these attempts, the best threshold performance was always accompanied by the appearance of a substantial "ear" at, or slightly above, the highest modulating frequency. Without the filtering described and with this characteristic in the control loop, optimum response is obtained by operating the loop near the unstable region thereof. Although it has since been determined that appearance of the "ear" is necessary for optimum performance in order to attempt to match the control loop response to the baseband frequency modulator, the approach outlined leaves much to be desired. For example, operation of the control loop near instability makes the performance very susceptible to minute changes in the loop parameters as well as minimizes effective control of the size and shape of the "ear" in the frequency response. On the other hand, the inclusion of a passive frequency shaping network in the control loop as described hereinabove results in very stable loop performance in addition to providing tailoring of the frequency response for optimum performance. Even though an "ear" is present in the closed loop frequency response, the "ear" exists by design and is completely controllable. It is observed that the optimum performance provided with the passive filter included substantially exceeds that which can be obtained when such a filter is not used.

Figure 4:
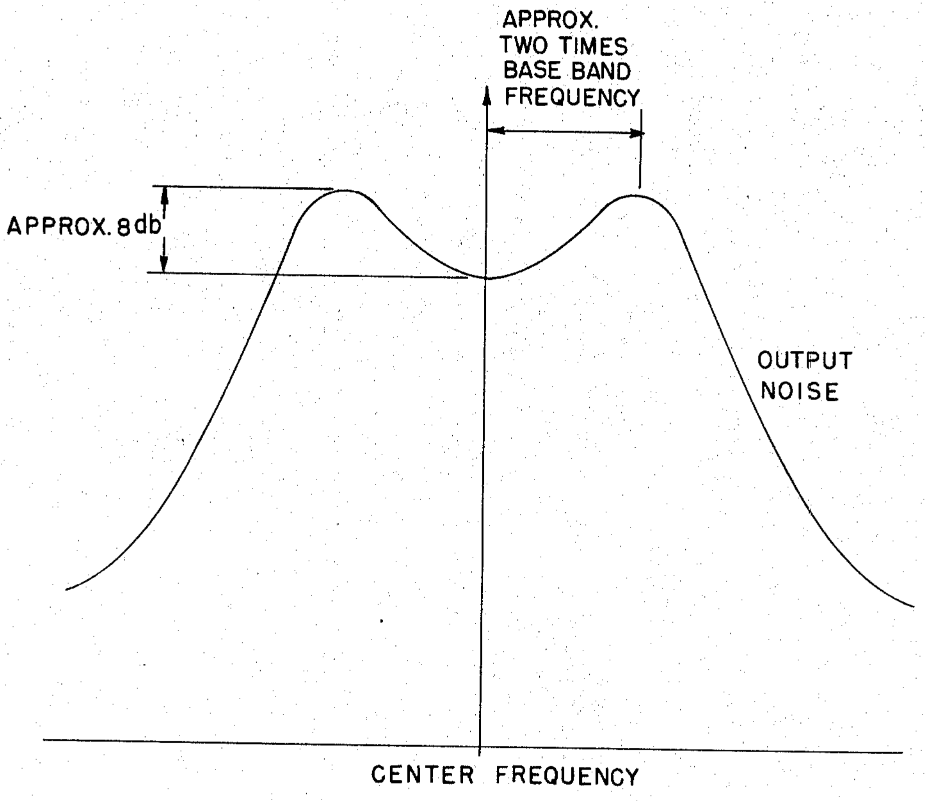
FIG. 4 is a representation of the noise output spectrum used in explanation of the operation of the circuit of FIG. 1.

An additional effect of providing the appropriate closed-loop frequency response can be noted by observing the noise spectrum at the IF output of the tracking filter circuit of FIG. 1. With a band of noise at the IF output terminal 34 and an unmodulated carrier, the IF output spectrum is characterized by two "ears" as shown in FIG. 4. It is noted that any attempt to eliminate these "ears" results in a corresponding degradation of the threshold performance.

Figure 5:
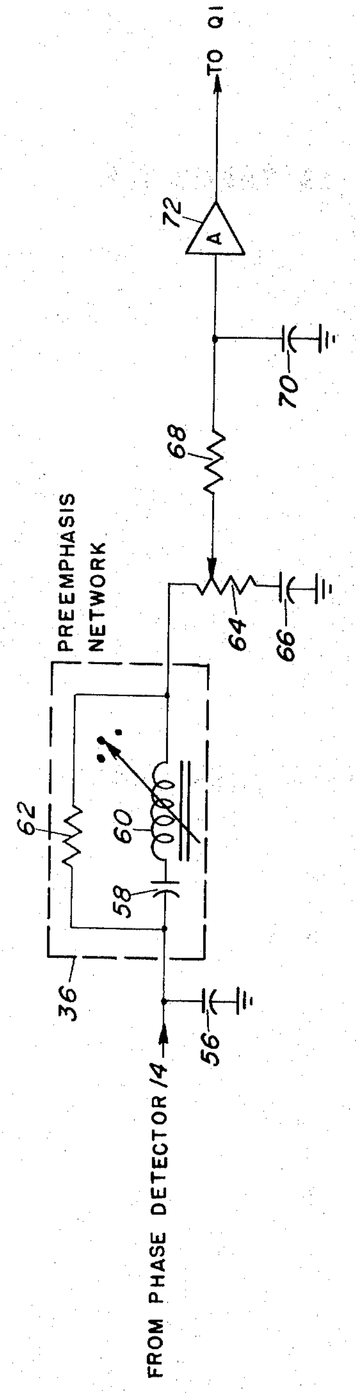
FIG. 5 is a schematic circuit diagram of the control loop of FIG. 1.

As mentioned hereinabove, the threshold improvement provided by the threshold extension circuit of the present invention can be optimized by employing a precise, optimum value of loop gain. A schematic circuit diagram of the control loop of FIG. 1 is shown in FIG. 5. The input to the loop as derived from phase detector 14 of FIG. 1 and the loop includes a shunt capacitor 56 which provides a shunt path to ground for residual RF signals from phase detector 14. The pre-emphasis or loop filter circuit 36 in this embodiment is a standard CCIR pre-emphasis network including a capacitor 58 and variable inductor 60 connected in series with each other and in parallel with a resistor 62. A potentiometer 64 is connected to the output of circuit 36 and provides the A.C. gain control. A capacitor 66 is connected between potentiometer 64 and ground and provides a virtual A.C. ground for signal components while permitting maximum D.C. gain for improved long-term stability against changes in temperature and component aging. An RC network formed by a resistor 68 and a capacitor 70 connected to the top of potentiometer 64 in front of an amplifier 72 provides additional selectivity which has been found beneficial to the circuit operation. Amplifier 72 and a following transistor (not shown) form amplifier 38 of FIG. 1 and provide a fixed gain to drive the varactor diodes of the tracking filter 12 of FIG. 1.

Figure 6:
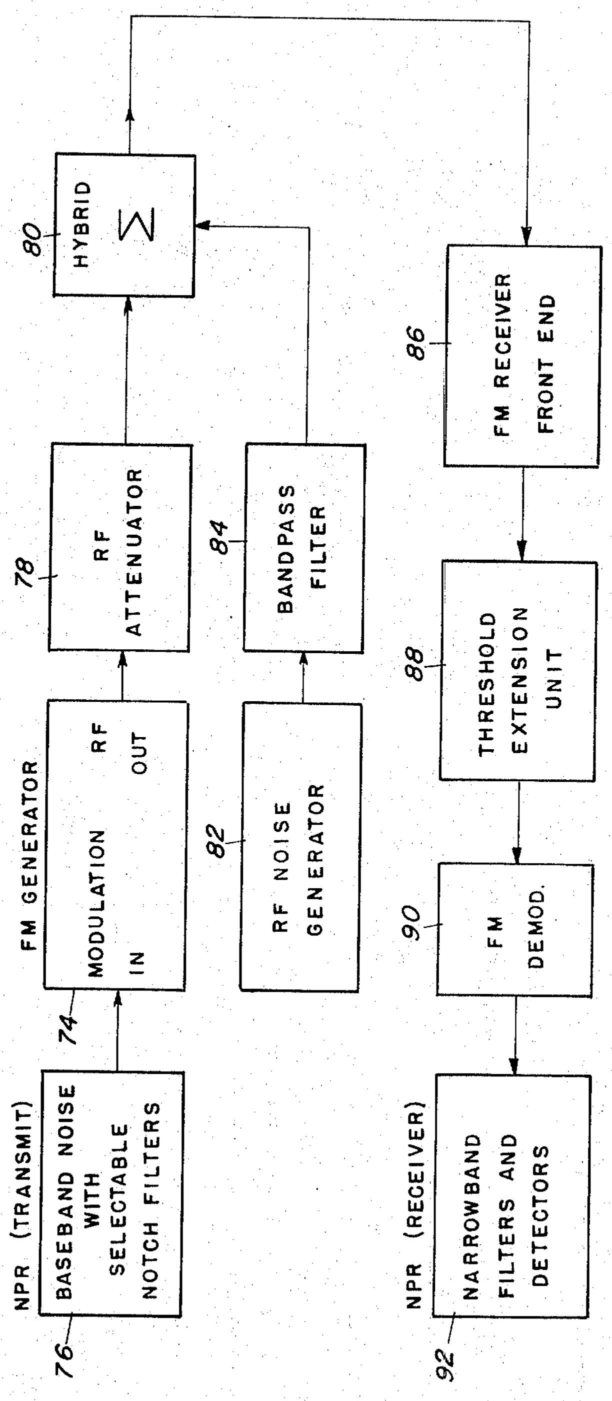
FIG. 6 is a block diagram of the test set-up used in optimizing the threshold improvement.

The test set-up used in adjusting the response of the circuit of FIG. 1 is shown in FIG. 6. The test set-up includes a signal source in the form of an FM generator 74 having a modulation input obtained from a noise-power-ratio (NPR) transmitter 76, such a transmitter commonly being referred to as a "white noise test set." The output of FM generator 74 is passed through an RF attentuator 78 to a hybrid running circuit 80 where it is added to high-level noise output of an RF noise generator 82 after passing through a bandpass filter 84. The receiver portion of the test set includes an FM receiver front end 86, which is optional depending upon the particular levels used and the like, and the threshold extension unit of the invention, which is denoted as 88 in FIG. 6. The output of unit 88 is connected to a conventional FM demodulator 90 which typically comprises suitable limiter, discriminator and baseband amplifier circuits. The output of demodulator 90 is connected to a NPR receiver 92 which consists of narrowband filters, detectors and associated metering circuitry.

Although noise-power-ratio measurements are well known in the art, the procedure may be summarized as follows: first, the baseband noise source in NPR transmitter 76 is adjusted in amplitude and bandwidth to represent the equivalent input modulation expected to be found in actual operation. The NPR receiver 92 is then tuned to a particular narrowband of frequencies in the baseband and the output is recorded. Next, the NPR transmitter 76 is switched so that a very sharp and deep notch is applied at the exact frequency of the NPR receiver 92. This notch removes the modulation that would normally be found at the corresponding baseband frequency. In practice, however, it is found that because of additive channel noise and intermodulation effects caused near and below threshold, the NPR receiver 92 will indicate a non-zero value of energy in the baseband frequency slot. The ratio, in decibels, of the readings of the NPR receiver 92 for the two conditions, i.e., NPR transmitter "slot" in and out, are defined as the noise power ratio, a large ratio obviously being indicative of good performance.

Adjustment of the threshold extension unit 88 is achieved in the following manner: By measuring the output power from hybrid summer 80 the FM carrier level and the RF noise are set at approximately equal values thereby establishing a nominal zero dB carrier-to-noise ratio, a ratio known to be "below threshold" for all FM systems. Under this condition, an NPR measurement is conducted as outlined above, and the loop gain is adjusted, using potentiometer 64 of FIG. 4, to an optimum value. It is noted that this adjustment is typically made at the low end of the modulation input spectrum to realize the most precise gain setting. It is emphasized that the value of gain is a true optimum and that either more or less gain will deteriorate the threshold performance.

Apart from the improved threshold performance resulting from the inclusion of the pre-emphasis type filter in the control loop as described hereinabove, it has been found that an additional advantage is provided by "matching" the control loop response to the baseband characteristic of the modulator. Without such filtering optimum threshold performance is accompanied by a substantial degradation in performance at high input carrier-to-noise ratios. However, the added control loop filtering results in a minimization of this degradation to a value that can be considered negligible. To be somewhat more specific, conventional threshold extension receivers which do not utilize the filtering technique described hereinabove are characterized by a substantial amount of intrinsic intermodulation distortion, this distortion previously considered to be the price pair for threshold extension. In a multi-channel telephone FM receiver this distortion amounts to several hundred picrowatts per telephone channel. The tracking filter circuit of FIG. 1 also exhibits this characteristic without the inclusion of the pre-emphasis type baseband filter whereas, with the filter included, the intermodulation noise due to the presence of the tracking filter circuit is reduced to a typical value of 20 picowatts per telephone channel. Further, the amount of threshold extension provided is at the very least equal to that provided by commercially available units. Thus, the incorporation of the threshold extension circuit into a conventional, commercially available modem having an intrinsic noise level of the same order to magnitude discussed, produces a threshold extension demodulator substantially superior to existing units.

As discussed hereinabove, the filtering technique of the present invention is also directly applicable to other known threshold extension circuits such as the FMFB and phase-locked loop demodulators discussed hereinabove and to variations on these demodulators. Demodulators of this type characteristically include a feedback or control loop and hence by incorporating a filtering network which "matches" the response of this loop to the frequency response characteristic of modulating signal, a substantial improvement in performance is produced. Reference is again made to the Schwartz et al text referred to hereinabove for a description of the FMFB and phase-locked loop modulators.

Although the invention has been described with respect to preferred embodiments thereof, it will be apparent to those skilled in the art other modifications and variations can be effected in these embodiments without departing from the scope and spirit of the invention.

In a general manner, while there has been disclosed effective and efficient embodiments of the invention, it should be well understood that the invention is not limited to such embodiments as there might be changes made in the arrangement, disposition, and form of the parts without departing from the principle of the present invention as comprehended within the scope of the accompanying claims.

We claim:

1. An improved frequency modulation communication system comprising, a transmitter including a modulator and means including a preemphasis network for producing a modulating signal, and a receiver including a tracking filter circuit means and a demodulator, said tracking filter circuit means including a control loop for regulating the filter characteristic of the tracking filter therein said control loop beginning at a point intermediate said tracking filter and said demodulator and terminating at one input of said tracking filter, the improvement comprising a pre-emphasis type filter connected in said control loop, said control loop further including means for adjusting the gain of said control loop to provide optimum noise threshold response, and wherein the frequency response characteristic of said control loop substantially matches the frequency response characteristic of said modulating signal.

2. A system as claimed in claim 1 wherein said pre-emphasis type filter is topologically identical to said pre-emphasis network.

3. The system as claimed in claim 1 wherein the tracking filter includes a first and second input means and an output means, said first input means being connected to receive an intermediate frequency input as a reference, said second input means being connected to said pre-emphasis type filter, said closed loop further including a phase detector having a first and second input means and one output means, said phase detector output means being connected as an input to said pre-emphasis type filter, said first phase detector input means being connected to said tracking filter output means, and said second phase detector input means being connected to receive said intermediate frequency input.

4. The system as claimed in claim 3 wherein said first tracking filter input means further includes a resistive network for controlling the band width of said tracking filter.

5. A system as claimed in claim 4 wherein said tracking filter circuit means includes a first emitter follower circuit connected to the output of said tracking filter, an amplitude limiter circuit connected to the output of said emitter follower circuit, a buffer amplifier connected to the output of said amplitude limiter circuit and including an output terminal to be connected to said demodulator, a second emitter follower circuit having the input thereof connected to the output of said amplitude limiter circuit and the output thereof connected to said first input means of said phase detector, and wherein said second phase detector input means includes a third emitter follower circuit connected to said intermediate frequency input, a 90° phase shifter connected to the output of said third emitter follower circuit, an amplitude limiter connected to the output of said phase shifter, a fourth emitter follower circuit having the input thereto connected to the output of said limiter and the output thereof connected to a second input of said phase detector, said phase detector output means further including an amplifier.

6. The system as claimed in claim 2 wherein said pre-emphasis type filter network comprises an inductance means and a capacitance means connected in a series network, said inductance and capacitance series network being connected in parallel with a resistance means.

7. A method for improving the signal-to-noise ratio in a frequency modulation communication system comprising, a transmitter including a pre-emphasis network for producing a modulating signal and a modulator, and a receiver including a tracking filter circuit and a demodulator, said tracking filter circuit including a control loop for regulating the filter characteristic of the tracking filter therein, said control loop beginning at a point intermediate said tracking filter and said demodulator and terminating at one input of said tracking filter, the improved method comprising the steps of:

substantially matching the frequency response characteristic of the control loop to the frequency response characteristic of said modulating signal, said matching being accomplished through the use of a pre-emphasis type filter located in said control loop, and adjusting the gain of the control loop so as to provide optimum noise threshold performance.

8. A method for improving the signal-to-noise ratio of a frequency modulation communication system including the steps of, generating an input signal, passing said signal through a pre-emphasis circuit thereby generating a modulating signal, modulating another signal with said modulating signal thereby producing a modulated signal output, transmitting said modulated signal to a remote point, receiving the transmitted signal, filtering the received signal by means of a tracking filter network, demodulating the filtered signal and passing said demodulated signal to other stages of the receiver, the improved method further comprising the steps of, feeding part of said filtered signal back to said tracking filter network, said feedback signal passing through a pre-emphasis type loop filter, substantially matching the frequency response characteristic of said modulating signal, said matching being accomplished through the use of said pre-emphasis type loop filter located in said control loop, and adjusting the gain of the control loop so as to provide optimum noise threshold performance.

* * * * *